United States Patent
Chang et al.

(10) Patent No.: US 11,456,266 B2
(45) Date of Patent: Sep. 27, 2022

(54) BUMP STRUCTURE AND METHOD OF MANUFACTURING BUMP STRUCTURE

(71) Applicant: TAIWAN SEMICONDUCTOR MANUFACTURING CO., LTD., Hsinchu (TW)

(72) Inventors: Ching-Yu Chang, Yuansun Village (TW); Ming-Da Cheng, Taoyuan (TW); Ming-Hui Weng, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/019,173

(22) Filed: Sep. 11, 2020

(65) Prior Publication Data
US 2021/0134746 A1 May 6, 2021

Related U.S. Application Data

(60) Provisional application No. 62/928,938, filed on Oct. 31, 2019.

(51) Int. Cl.
*H01L 23/00* (2006.01)
*C08G 73/10* (2006.01)

(52) U.S. Cl.
CPC .......... *H01L 24/05* (2013.01); *C08G 73/1078* (2013.01); *C08G 73/1085* (2013.01);
(Continued)

(58) Field of Classification Search
CPC ......... H01L 24/05; H01L 24/03; H01L 24/13; H01L 2224/02251; H01L 2224/0226;
(Continued)

(56) References Cited

U.S. PATENT DOCUMENTS 11,279,802 B2    3/2022  Koyama et al.
2016/0333238 A1* 11/2016 Fraivillig ........... C08G 73/1067
(Continued)

FOREIGN PATENT DOCUMENTS

CN    103718109 A    4/2014
JP    2000-183089 A   6/2000
(Continued)

OTHER PUBLICATIONS

GC-MS / LC-MS (Mar. 31, 2016) <http://rd.nctu.edu.tw/web.case/nctu-rd-2/upload/ckeditor/20160331010601.pdf>.

*Primary Examiner* — Douglas W Owens
(74) *Attorney, Agent, or Firm* — McDermott Will & Emery LLP

(57) ABSTRACT

A method of manufacturing a bump structure includes forming a passivation layer over a substrate. A metal pad structure is formed over the substrate, wherein the passivation layer surrounds the metal pad structure. A polyimide layer including a polyimide is formed over the passivation layer and the metal pad structure. A metal bump is formed over the metal pad structure and the polyimide layer. The polyimide is a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring.

20 Claims, 11 Drawing Sheets

(52) U.S. Cl.
CPC .............. *H01L 24/03* (2013.01); *H01L 24/11* (2013.01); *H01L 24/13* (2013.01); *H01L 2224/0226* (2013.01); *H01L 2224/02251* (2013.01); *H01L 2224/0345* (2013.01); *H01L 2224/03452* (2013.01); *H01L 2224/03462* (2013.01); *H01L 2224/03616* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05176* (2013.01); *H01L 2224/05181* (2013.01); *H01L 2224/05184* (2013.01); *H01L 2224/1145* (2013.01); *H01L 2224/11452* (2013.01); *H01L 2224/11462* (2013.01); *H01L 2224/11849* (2013.01); *H01L 2224/1312* (2013.01); *H01L 2224/1316* (2013.01); *H01L 2224/1318* (2013.01); *H01L 2224/13026* (2013.01); *H01L 2224/13082* (2013.01); *H01L 2224/13111* (2013.01); *H01L 2224/13116* (2013.01); *H01L 2224/13118* (2013.01); *H01L 2224/13123* (2013.01); *H01L 2224/13124* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13166* (2013.01); *H01L 2224/13171* (2013.01); *H01L 2224/13179* (2013.01); *H01L 2224/13181* (2013.01); *H01L 2224/13184* (2013.01); *H01L 2924/014* (2013.01); *H01L 2924/04941* (2013.01); *H01L 2924/04953* (2013.01); *H01L 2924/07025* (2013.01)

(58) Field of Classification Search
CPC ........... H01L 2224/13026; H01L 2924/07025; C08G 73/1078; C08G 73/1085; C08G 73/1067
See application file for complete search history.

(56) References Cited

U.S. PATENT DOCUMENTS

| | | | |
|---|---|---|---|
| 2021/0375674 A1* | 12/2021 | Cheng | ............... H01L 21/76885 |
| 2021/0375675 A1* | 12/2021 | Cheng | ............... H01L 21/76885 |

FOREIGN PATENT DOCUMENTS

| | | | | |
|---|---|---|---|---|
| KR | 10-2009-0075883 A | 7/2009 | | |
| KR | 10-2017-0084364 A | 7/2017 | | |
| KR | 10-2018-0130099 A | 12/2018 | | |
| TW | 201144383 A | 12/2011 | | |
| TW | 201906896 A | 2/2019 | | |
| TW | 201940551 A | 10/2019 | | |
| WO | 2008/054680 A2 | 5/2008 | | |
| WO | 2014/046062 A1 | 3/2014 | | |
| WO | 2017/170032 A1 | 10/2017 | | |
| WO | WO-2018021331 A1 * | 2/2018 | ........... | C08G 73/106 |
| WO | WO-2019181782 A1 * | 9/2019 | ........... | G03F 7/0757 |

* cited by examiner

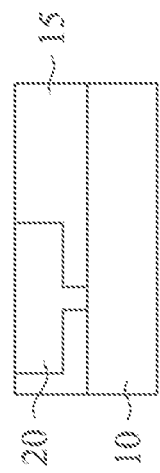
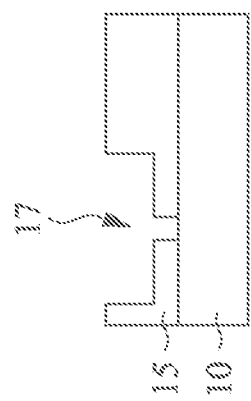
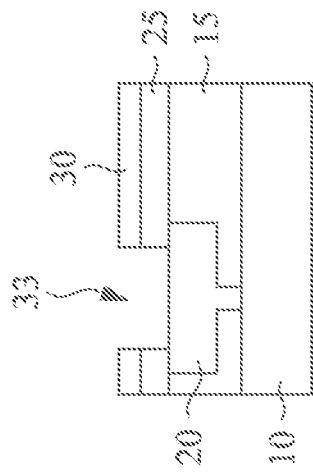
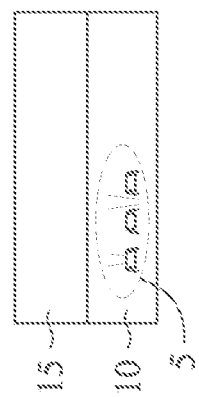
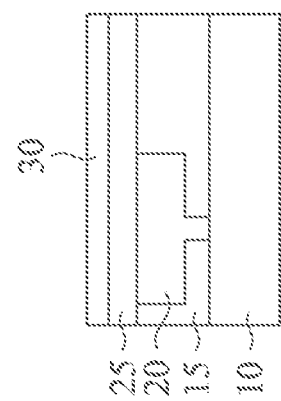
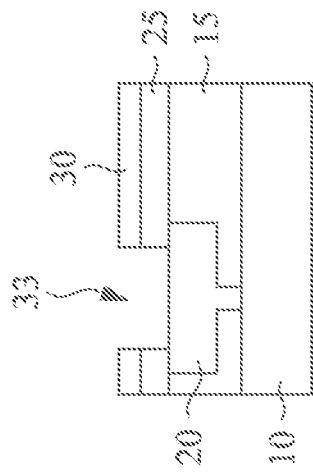

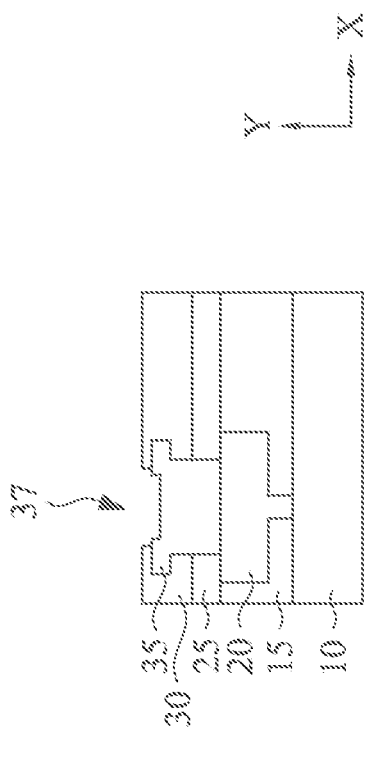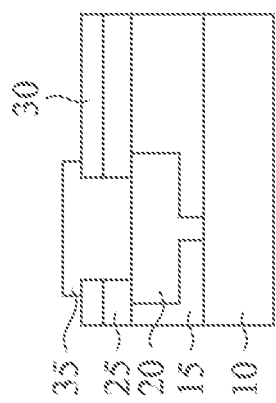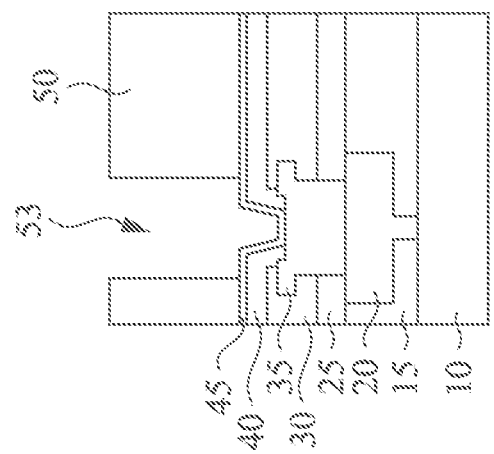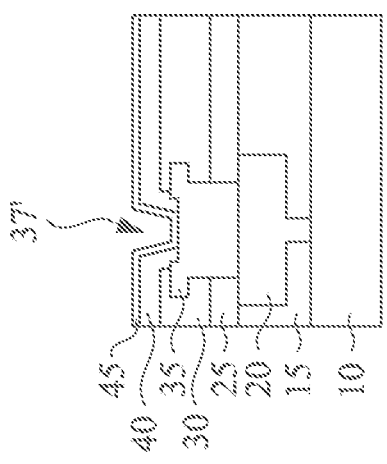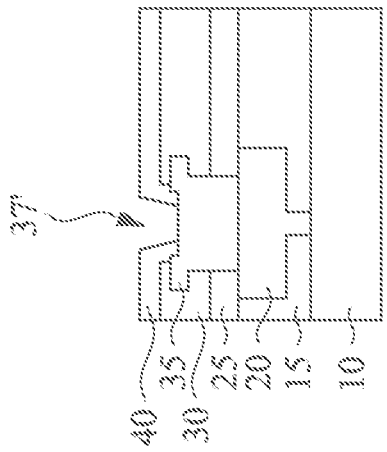
FIG. 1G
FIG. 1H
FIG. 1I
FIG. 1J
FIG. 1K 4,4'-Biphthalic Anhydride 5,5'-(9H-Fluorene-9,9-diyl)bis(2-benzofuran-1,3-dione)

4,4'-(Ethyne-1,2-diyl)-diphthalic Anhydride

Cyclobutanetetracarboxylic Dianhydride

Bicyclo[2.2.2]oct-7-ene-2,3,5,6-tetracarboxylic Dianhydride 2,3,6,7-Naphthalenetetracarboxylic 2,3,6,7-Dianhydride 3,4,9,10-Perylenetetracarboxylic Dianhydride

BUMP STRUCTURE AND METHOD OF MANUFACTURING BUMP STRUCTURE

RELATED APPLICATION

This application claims priority to U.S. Provisional Patent Application No. 62/928,938 filed Oct. 31, 2019, the entire content of which is incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques such as forming connections between semiconductor devices.

As electronic industry develops three dimensional integrated circuits (3D IC) on the basis of through-Si-vias (TSV) technology, the processing and reliability of bumps, which are used to interconnect the stacked chips, is being actively investigated. Delamination of dielectric layers, such as extreme low-k dielectric layers, in the region of the bumps is an issue in smaller devices. Delamination of extreme low-k dielectric layers can lead to device failure or malfunction.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D, 1E, 1F, 1G, 1H, 1I, 1J, 1K, 1L, 1M, and 1N are cross-sectional views of stages of a sequential method of manufacturing a bump structure according to an embodiment of the disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the present disclosure are directed to polyamic acid compositions, bump structures including a polyimide layer, semiconductor devices, methods of forming polyimide layers, methods of manufacturing bump structures, and methods of manufacturing semiconductor devices. Embodiments of the disclosure are directed to bump structures for an integrated circuit including polyimide layers with higher Young's modulus.

Figure 1L:
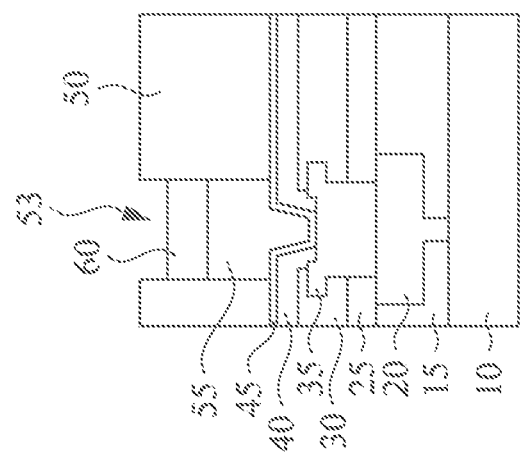
Figure 1M:
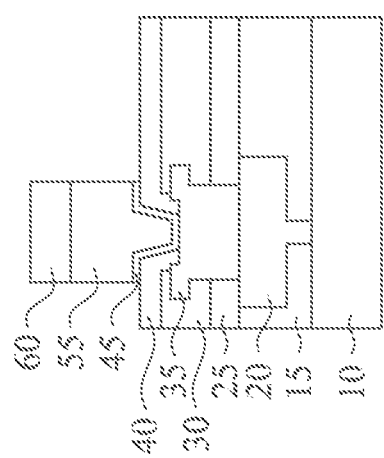
Figure 1N:
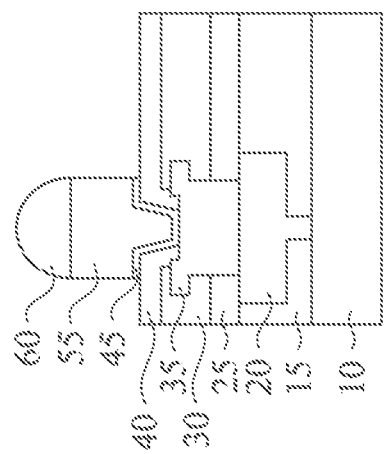

FIGS. 1A-1N are cross-sectional views of stages of a sequential method of manufacturing a bump structure according to an embodiment of the disclosure. It is understood that additional operations can be provided before, during, and after processes shown by FIGS. 1A-1N, and some of the operations described below can be replaced or eliminated, for additional embodiments of the method. The order of the operations/processes may be interchangeable. As shown in FIG. 1A, a dielectric layer 15 is formed over a substrate 10 in some embodiments. In some embodiments, the substrate 10 includes a semiconductor device 5 disposed over a semiconductor wafer, such as a silicon wafer. In some embodiments, the semiconductor device 5 includes one or more transistors, such as field effect transistors. In other embodiments, the semiconductor device 5 includes capacitors, inductors, resistors, diodes, integrated circuits, and related wiring and interconnects embedded in an insulating layer.

The dielectric layer 15 is an interlayer dielectric (ILD) layer in some embodiments. The materials for the ILD layer 15 include compounds comprising Si, O, C and/or H, such as silicon oxide, SiCOH and SiOC. In some embodiments, the dielectric layer is an extreme low-k (ELK) material, which has a dielectric constant less than about 2.5. In some embodiments, the ELK has a dielectric constant between about 1.8 to about 2.1. In some embodiments, the ELK materials include porous SiCOH or porous SiOC. The dielectric layer 15 may be formed by chemical vapor deposition (CVD), low pressure chemical vapor deposition (LPCVD), plasma enhanced chemical vapor deposition (PECVD) or atomic layer deposition (ALD), or any other suitable film formation method. Organic materials, such as polymers, may also be used for the ILD layer 15.

In some embodiments, openings or trenches 17 are formed in the dielectric layer 15 using suitable photolithographic and etching operations, as shown in FIG. 1B. The opening is positioned over electrical contacts on the semiconductor device 5 in the substrate in some embodiments. As shown in FIG. 1C, the opening 17 is subsequently filled with an electrically conductive material, such as a metal, to form a metal contact 20 connecting the semiconductor device 5 and a metal pad structure to be subsequently formed. In some embodiments, the metal includes aluminum, copper, nickel, titanium, tantalum, tungsten, cobalt, molybdenum, and alloys thereof. The metal may be deposited by physical vapor deposition (PVD), such as sputtering, chemical vapor deposition (CVD), atomic layer deposition (ALD), or electroplating. In some embodiments, after depositing the metal, a planarization operation is performed to remove metal overlying the upper surface of the dielectric layer 15. In some embodiments, the planarization operation is a chemical-mechanical polishing (CMP) operation or an etchback operation. In some embodiments, the metal contact 20 is a metal interconnect.

A passivation layer 25 is subsequently formed over the dielectric layer 15 and the metal contact 20, as shown in FIG. 1D. In some embodiments, the passivation layer 25 is a first passivation layer and one or more additional passivation layers are formed over the first passivation layer 25. For example, as shown in FIG. 1E, a second passivation layer 30 is formed over the first passivation layer 25. In some embodiments, the first passivation layer 25 and the second passivation layer 30 are formed of different material, or are formed under different deposition parameters to provide passivation layers having different physical properties, such as different densities and porosities. The first and second passivation layers may be an oxide layer, such as a silicon oxide, or a nitride layer, such as a silicon nitride. In some embodiments, the first passivation layer 25 is silicon dioxide and the second passivation layer 30 is silicon nitride. In some embodiments, the first and second passivation layers independently have a thickness ranging from about 1 μm to about 5 μm. In some embodiments, if the passivation layers are less than about 1 μm the passivation layers do not have sufficient thickness, and if the passivation layers are greater than about 5 μm no additional benefit is obtained and the overall device thickness is unnecessarily increased.

An opening 33 is formed in the passivation layer(s) using suitable photolithographic and etching operations exposing the metal contact 20, as shown in FIG. 1F. Then, a metal pad structure 35 is formed by forming a metal layer over the opening 33 and the passivation layer 30, as shown in FIG. 1G. In some embodiments, the metal pad structure 35 is made of aluminum, copper, silver, gold, nickel, tungsten, titanium, tin, titanium nitride, hafnium, ruthenium, tantalum, tantalum nitride, alloys thereof, or multilayers thereof. In some embodiments, the metal pad is an AlCu alloy. The metal layer is formed by physical vapor deposition, chemical vapor deposition, atomic layer deposition, or electroplating in some embodiments. The metal layer undergoes planarization, such as by chemical mechanical polishing (CMP) or an etchback operation in some embodiments. In some embodiments, portions of the metal layer overlying the second passivation layer 30 are removed by suitable photolithographic and etching operations to form the metal pad structure 35.

After forming the metal pad structure 35, deposition of the second passivation layer 30 continues so that the second passivation layer 30 covers the top surface of the metal pad structure 35. In some embodiments, a third passivation layer is formed, wherein the third passivation layer is a different material than the second passivation layer. Then, the second passivation layer 30 is planarized, such as by CMP or an etchback, and an opening 37 is formed in the second passivation layer 30 over the metal pad structure 35 using suitable photolithographic and etching operations. In some embodiments, the top of the metal pad structure 35 is recessed using suitable photolithographic patterning and etching operations, as shown in FIG. 1H. In some embodiments, an upper portion of the metal pad structure 35 extends along the X-direction (horizontal direction) from the lower sidewalls, which extend in the Y-direction (vertical direction) of the metal pad structure 35.

As shown in FIG. 1I, an organic material (e.g., polymer) layer, such as a polyimide layer 40 including a polyimide, is formed over the second passivation layer 30 and the metal pad structure 35. The polyimide film 40 is patterned using suitable photolithographic and etching operations to expose the surface of the metal pad structure 35 through an opening 37'. In some embodiments, the polyimide layer 40 has a thickness ranging from about 2 μm to about 10 μm after curing. If the thickness of the polyimide layer is less than about 2 μm the polyimide layer may provide insufficient protection of the passivation layer, and if the polyimide layer thickness is greater than about 10 μm no additional benefit is obtained and the overall device thickness is unnecessarily increased.

In some embodiments, the polyimide layer 40 is made by forming a polyamic acid composition including a polyamic acid over the device and then converting the polyamic acid to a polyimide by heating the polyamic acid at a temperature ranging from about 150° C. to about 350° C. At temperatures below about 150° C., there may not be a sufficient amount of the polyamic acid converted to polyimide. At temperatures above about 350° C., the substrate may be warped or damaged. The polyimide layer acts as a buffer layer to distribute the pressure generated during a flip chip bonding operation across the surface of the device, thereby protecting the device from damage when the pressure is concentrated in the area around the bump.

Figure 2:
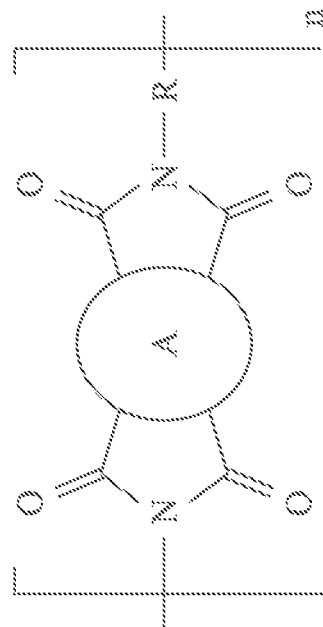
FIG. 2 illustrates the formation of a polyimide according to embodiments of the disclosure.
Figure 2:
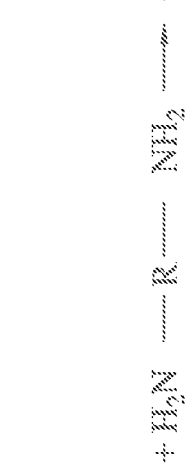
Figure 2:
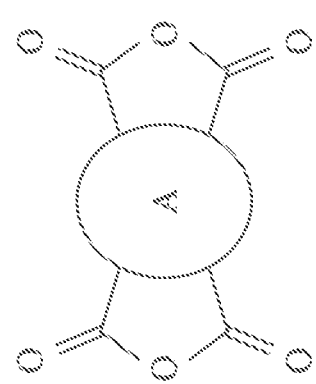

In some embodiments, the polyamic acid is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. The reaction of dianhydride and a diamine to form a polyimide is illustrated in FIG. 2. The dianhydride and diamine initially form a polyamic acid, and the polyamic acid is converted to a polyimide upon heating the polyamic acid in some embodiments.

In some embodiments, at least one of the dianhydride and the diamine includes a tricycloalkane or tricycloalkene. In some embodiments, at least one of the dianhydride and diamine includes two or more cyclic groups. In some embodiments, the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—. In some embodiments, the cycloalkane is selected from the group consisting of cyclopropane, cyclobutane, cyclopentane, cyclohexane, cycloheptane, and cyclooctane. In some embodiments, the fused ring is selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In some embodiments, the bicycloalkane is bicyclo[3.2.0]heptane. In some embodiments, the tricycloalkane is adamantane. In some embodiments, the spiroalkane is spiro[2.2]pentane. In some embodiments, the heterocyclic ring is selected from the group consisting of thiolane, oxolane, and pyrrole.

Figure 3A:
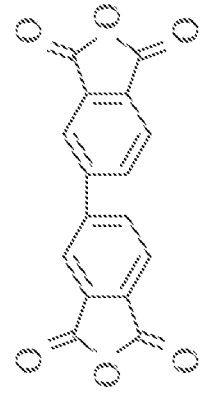
FIG. 3A illustrates various dianhydride reactants used in forming polyimides according to embodiments of the disclosure.
Figure 3A:
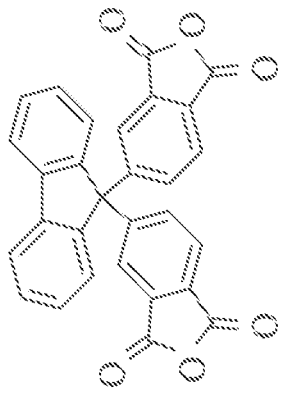
Figure 3A:
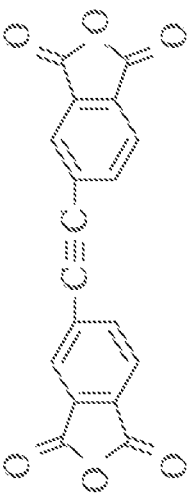
Figure 3A:
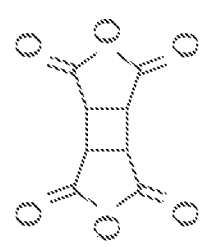
Figure 3A:
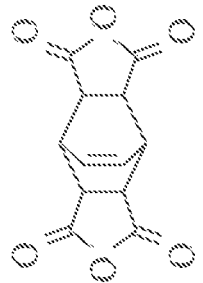
Figure 3A:
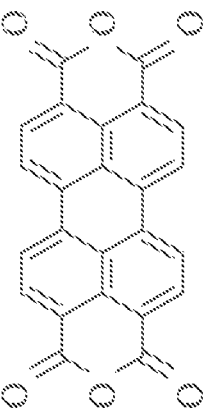
Figure 3B:
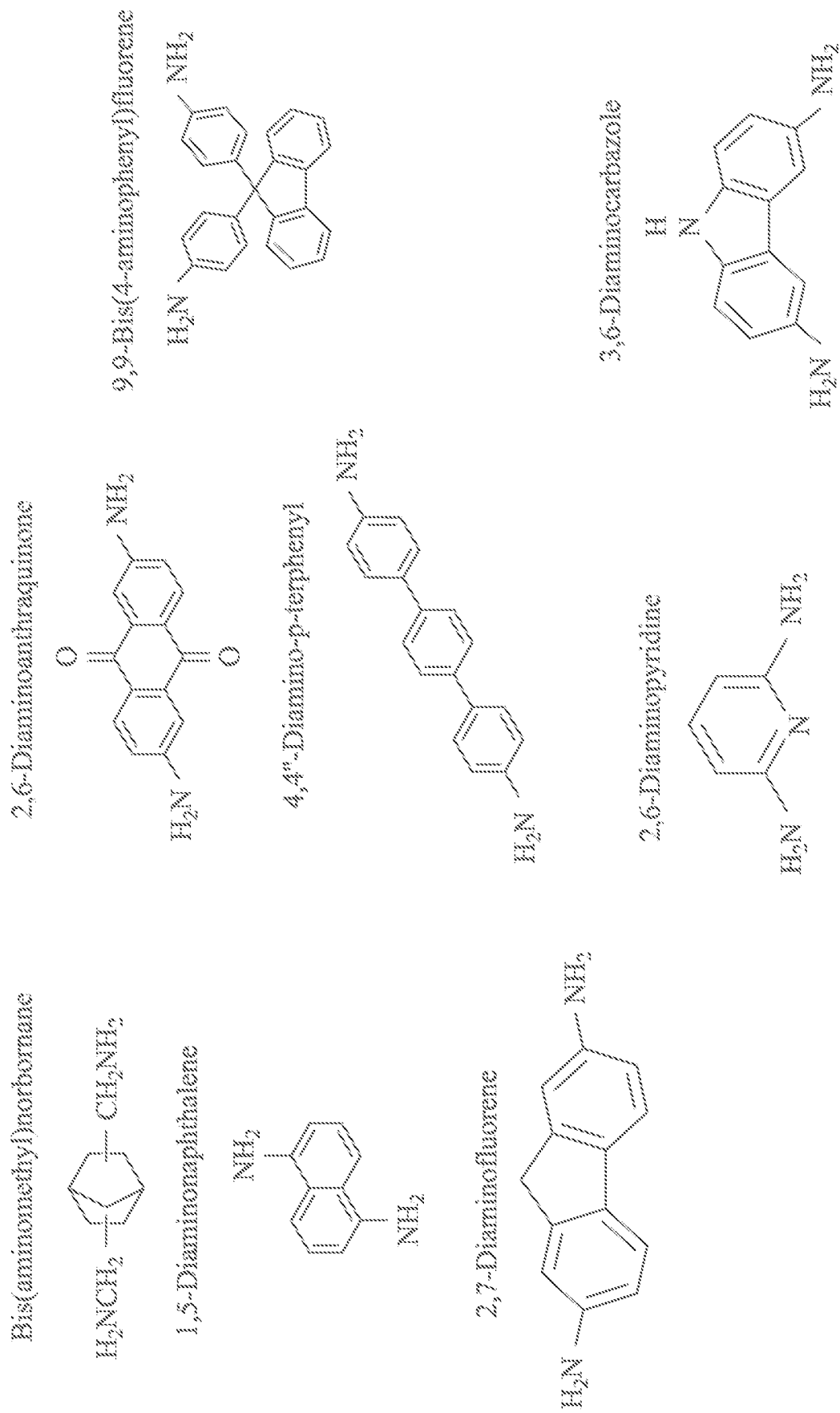
FIG. 3B illustrates various diamine reactants used in forming polyimides according to embodiments of the disclosure.

In some embodiments, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis(2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride, as shown in FIG. 3A. In some embodiments, the diamine is selected from the group consisting of bis(aminoethyl)norbornane, 2,6-diaminoanthraquinone, 1,5-diaminonaphthalene, 4,4"-diamino-p-terphenyl, 9,9-bis(4-aminophenyl)fluorene, 2,7-diaminofluorene, 2,6-diaminopyridine, and 3,6-diaminocarbazole, as shown in FIG. 3B.

In some embodiments, the polyimide layer 40 has a Young's modulus ranging from about 4.5 GPa to about 7 GPa. In some embodiments, the polyimide layer 40 has a Young's modulus ranging from greater than 5 GPa to about 7 GPa.

In some embodiments, an under bump metallization layer (seed layer) 45 is formed over the polyimide layer 40 and the metal pad structure 35, as shown in FIG. 1J. In some embodiments, the under bump metallization layer 45 includes a bilayer of a titanium-based layer and a copper-based layer. In some embodiments, the titanium-based layer includes titanium, titanium alloys, and titanium compounds containing 50 mol % or greater titanium, and the copper-based layer includes copper, copper alloys, and copper compounds containing 50 mol % or greater copper. In some embodiments, the under bump metallization layer 45 has a thickness ranging from about 50 nm to about 1 µm. In some embodiments, the titanium-based layer is the lower layer of the bilayer, and the titanium-based layer has a thickness ranging from about 25 nm to about 400 nm. In other embodiments, the titanium-based layer has a thickness ranging from about 50 nm to about 200 nm. In some embodiments, the copper-based layer is the upper layer of the bilayer, and the copper-based layer has a thickness ranging from about 25 nm to about 800 nm. In other embodiments, the copper-based layer has a thickness ranging from about 100 nm to about 600 nm.

Then, a photoresist layer 50 is formed over the under bump metallization layer 45 or polyimide layer 40, as shown in FIG. 1K. The photoresist layer 50 is patterned using suitable photolithographic operations to form an opening 53 in the photoresist layer over the metal pad structure 35. The photoresist layer 50 may be a positive tone resist or a negative tone resist. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern (i.e.—the exposed regions are removed by the developer) when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development. In some embodiments of the present disclosure, a negative tone photoresist is exposed to actinic radiation. The exposed portions of the negative tone photoresist undergo crosslinking as a result of the exposure to actinic radiation, and during development the unexposed, non-crosslinked portions of the photoresist are removed by the developer leaving the exposed regions of the photoresist remaining on the substrate.

A metal bump 55 is subsequently disposed over the metal pad structure 35 and the polyimide layer 40. As shown in FIG. 1L, the metal bump is formed by depositing a metal in the photoresist opening 53. The metal bump 55 is in electrical contact with the metal pad structure 35. In some embodiments, the metal bump 55 is in electrical contact with the metal pad structure 35 via the under bump metallization layer 45. In some embodiments, the metal bump 55 is formed of one or more metals selected from the group consisting of aluminum, copper, chromium, iron, manganese, magnesium, molybdenum, nickel, tin, niobium, tantalum, titanium, tungsten, zinc, and alloys thereof. In some embodiments, the metal bump 55 is formed by electroplating, physical vapor deposition, chemical vapor deposition, or evaporation deposition. In some embodiments, the metal bump 55 has a thickness ranging from about 500 nm to about 50 µm.

In some embodiments, a solder layer 60 is formed over the metal bump. In some embodiments, the solder layer is made of a tin-containing alloy selected from the group consisting of PbSn, AgSn, SnAgCu, CuSnNi, AgCuSbSn, AuSn, and CuSn.

Then, the photoresist layer 50 is removed, as shown in FIG. 1M, using a suitable photoresist removal technique, such as a solvent stripping operation or plasma ashing operation. In some embodiments, the exposed portion of the under bump metallization layer 45 is removed by a suitable etching operation. After removal of the photoresist layer 50, the solder layer 60 is reflowed to form a smooth, hemispherical shape in some embodiments, as shown in FIG. 1N. The solder layer 60 is reflowed by heating the solder to a temperature at which it softens and flows.

Figure 4C:
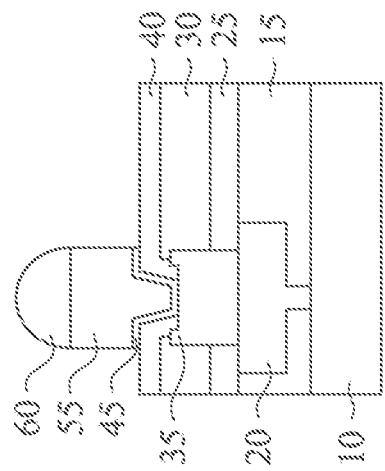
FIGS. 4A, 4B, and 4C are cross-sectional views of stages of a sequential method of manufacturing a bump structure according to an embodiment of the disclosure.
Figure 4B:
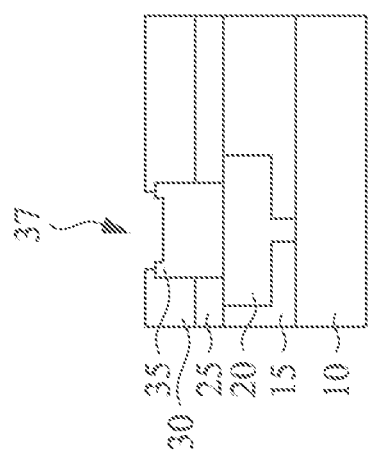
Figure 4A:
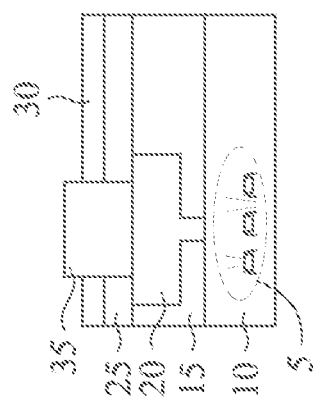

FIGS. 4A, 4B, and 4C are cross-sectional views of stages of a sequential method of manufacturing a semiconductor device according to an embodiment of the disclosure. The structure in FIG. 4A is made by the operations explained herein in reference to FIGS. 1A-1F. Then, a metal pad structure 35 is formed by forming a metal layer over the opening 33 and the passivation layer 30, as shown in FIG. 4A. In some embodiments, the metal pad structure 35 is made of aluminum, copper, silver, gold, nickel, tungsten, titanium, tin, titanium nitride, hafnium, ruthenium, tantalum, tantalum nitride, alloys thereof, or multilayers thereof. In some embodiments, the metal pad is an AlCu alloy. The metal layer is formed by PVD, CVD, ALD, or electroplating in some embodiments. The metal layer undergoes planarization, such as by CMP or etchback operation in some embodiments. In some embodiments, portions of the metal layer overlying the second passivation layer 30 are removed by suitable photolithographic and etching operations to form the metal pad structure 35.

After forming the metal pad structure 35, deposition of the second passivation layer 30 continues so that the second passivation layer covers the top surface of the metal pad structure 35. Then, the second passivation layer 30 is planarized, such as by CMP or an etchback, and an opening 37 is formed in the second passivation layer 30 over the metal pad structure 35 using suitable photolithographic and etching operations. In some embodiments, the top of the metal pad structure 35 is recessed using suitable photolithographic patterning and etching operations, as shown in FIG. 4B. In some embodiments, the sidewalls of the metal pad structure 35 are arranged in a substantially straight line along the Y-direction.

The structure of FIG. 4B is subsequently processed in the manner as described in reference to FIGS. 1I to 1N, to provide the structure as shown in FIG. 4C having a metal bump structure 55 with a reflowed hemispherical solder layer 60.

Figure 5B:
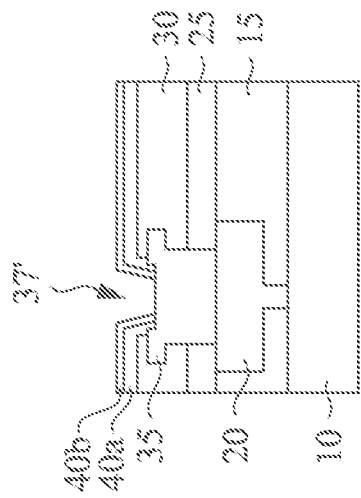
FIGS. 5A, 5B, 5C, 5D, 5E, 5F, and 5G are cross-sectional views of stages of a sequential method of manufacturing a bump structure according to an embodiment of the disclosure.
Figure 5A:
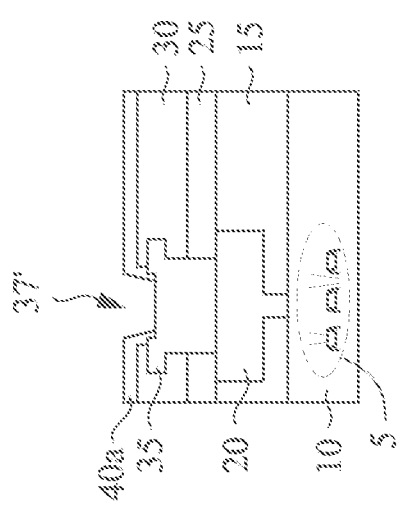

FIGS. 5A-5G are cross-sectional views of stages of a sequential method of manufacturing a semiconductor device according to an embodiment of the disclosure. The structure in FIG. 5A is made by the operations explained herein in reference to FIGS. 1A-1L. After the first polyimide layer 40a is formed, a second polyimide layer 40b is formed over the first polyimide layer 40a, as shown in FIG. 5B. The first polyimide layer 40a includes a first polyimide and the second polyimide layer 40b includes a second polyimide. Each of the first polyimide and the second polyimide are a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. The first and second polyimide layers 40a, 40b are formed of the materials and according to the methods disclosed herein in reference to FIG. 1L.

The first and second polyimides are selected to provide the desired Young's Modulus in some embodiments. In some embodiments, the first and second polyimide layers 40a, 40b have different Young's modulus, and the Young's modulus of the combined first and second polyimide layers ranges from about 4.5 GPa to about 7 GPa. In some embodiments, the Young's modulus of the combined first and second polyimide layers ranges from greater than 5 GPa to about 7 GPa. In some embodiments, the Young's modulus of the first polyimide layer 40a is greater than the second polyimide layer 40b. In other embodiments, the Young's modulus of the second polyimide layer 40b is greater than the first polyimide layer 40a.

In some embodiments, the first polyimide layer 40a is formed by applying a polyamic acid composition over the passivation layer 30 and the metal pad structure 35 to form a first polyamic acid layer, and then converting the first polyamic acid layer to the first polyimide layer 40a by heating the first polyamic acid layer at a temperature ranging from about 150° C. to about 350° C. Then, the second polyimide layer 40b is formed by applying a polyamic acid composition over the first polyimide layer 40a to form a second polyamic acid layer, and then the second polyamic acid layer is converted to the second polyimide layer 40b by heating the second polyamic acid layer at a temperature ranging from about 150° C. to about 350° C. In other embodiments, the first polyamic acid layer is formed over the passivation layer 30 and metal pad structure 35. The second polyamic acid layer is formed over the first polyamic acid layer, and then both polyamic acid layers are heated at a temperature ranging from about 150° C. to about 350° C. to convert the first and second polyamic acid layers to the first and second polyimide layers 40a, 40b. In some embodiments, the polyamic acid composition is mixed with a solvent and applied to the device structure by a coating operation, such as a spin-on coating operation. The polyamic acid layer is subsequently heated at temperature ranging from about 40° C. to about 120° C. to dry the polyamic acid layer and remove excess solvent prior to converting the polyamic acid layer to the polyimide layer.

In some embodiments the thickness of each of the first and second polyimide layers 40a, 40b ranges from about 1 μm to about 9 μm, and the total thickness of the first and second polyimide layers 40a, 40b ranges from about 2 μm to about 10 μm after curing the polyimide layers.

Figure 5D:
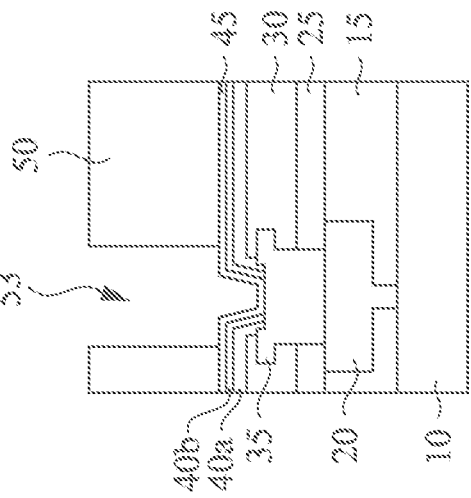
Figure 5C:
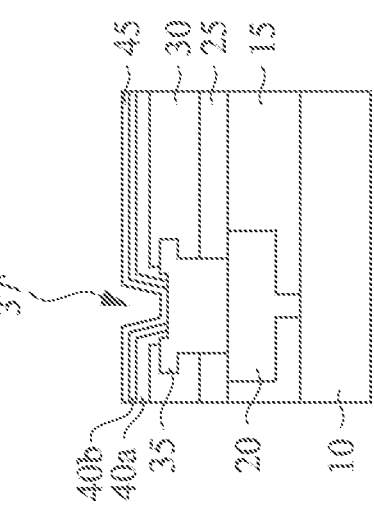

In some embodiments, an under bump metallization layer (seed layer) 45 is formed over the second polyimide layer 40b and the metal pad structure 35, as shown in FIG. 5C. In some embodiments, the under bump metallization layer 45 includes a bilayer of a titanium-based layer and a copper-based layer. In some embodiments, the under bump metallization layer 45 has a thickness ranging from about 50 nm to about 1 μm.

Then, a photoresist layer 50 is formed over the under bump metallization layer 45 or the second polyimide layer 40b, as shown in FIG. 5D. The photoresist layer 50 is patterned using suitable photolithographic operations to form an opening 53 in the photoresist layer over the metal pad structure 35.

Figure 5E:
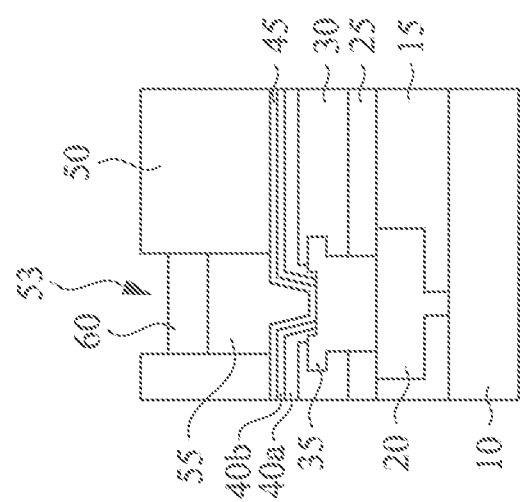

A metal bump 55 is subsequently disposed over the metal pad structure 35 and the second polyimide layer 40b or under bump metallization layer 45, as shown in FIG. 5E, in a similar manner as described herein in reference to FIG. 1L. As shown in FIG. 5E, the metal bump 55 is formed by depositing a metal, such as one or more metals selected from the group consisting of aluminum, copper, chromium, iron, manganese, magnesium, molybdenum, nickel, tin, niobium, tantalum, titanium, tungsten, zinc, and alloys thereof in the photoresist opening 53. A solder layer 60 is formed over the metal bump 55.

Figure 5F:
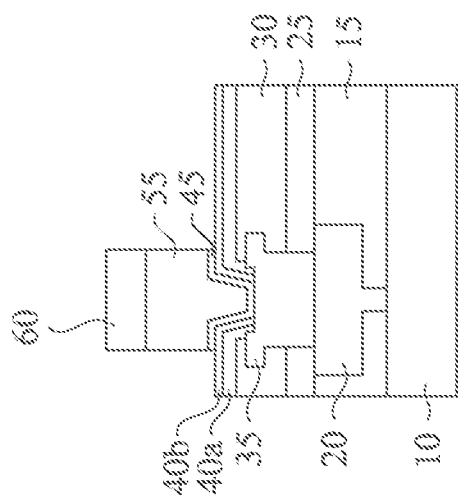
Figure 5G:
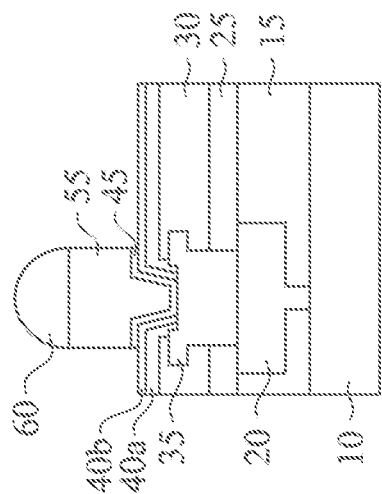

Then, the photoresist layer 50 is removed, as shown in FIG. 5F, using a suitable photoresist removal technique, such as a solvent stripping operation or plasma ashing operation. After removal of the photoresist layer 50, the solder layer 60 is reflowed to form a smooth, hemispherical shape in some embodiments, as shown in FIG. 5G, and as described in reference to FIG. 1N.

In some embodiments, the polyimide layer 40, 40a is adhered to the passivation layer 30 or the metal pad structure 35 by an adhesion promotor. The adhesion promotor is chemically bonded to the polyimide layer 40, 40a, the passivation layer 30, and the metal pad structure 35. In some embodiments, the adhesion promotor is bonded to the polyimide layer 40, 40a through cross-linking groups on the adhesion promotor. In some embodiments, the cross-linking groups are one or more selected from the group consisting of an alkyl oxide group, an alkene group, an alkyne group, and a triazine group. In some embodiments, the adhesion promotor is bonded to the passivation layer 30 through silanol groups on the adhesion promotor.

Figure 6A:
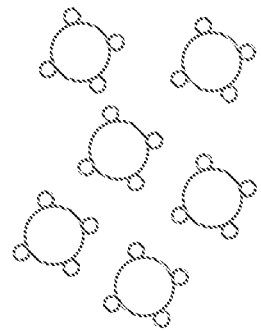
FIG. 6A illustrates an adhesion promotor to improve adhesion of the polyimide layer to metal substrates.

FIG. 6A illustrates an adhesion promotor that improves adhesion of the polyimide layer to substrates. One end A of the adhesion promotor adheres to the substrate (metal, passivation layer, or dielectric layer), while the other end B of the adhesion promotor adheres to the polyimide layer. The two ends A, B of the adhesion promotor are attached to each other by a chain linker group. In some embodiments, the chain linker group is a hydrocarbon chain.

In some embodiments, the adhesion promotor includes a chelating group, or a silanol group at one end A, and a cross linker group at the other end B. The chelating group includes one or more of N, O, S, or a halogen. In some embodiments, the adhesion promotor is adhered to the metal pad structure 35 through the chelating group. In some embodiments, the adhesion promotor is adhered to the passivation layer 30 through the silanol group. In some embodiments, the adhesion promotor is adhered to the polyimide layer 40, 40a through the cross linker group.

In some embodiments, the chelating group is one or more selected from the group consisting of a thiol, a thiirane, a thiirene, a thietane, a thiolane, a thiophene, a thiane, a thiopyran, a thiepane, a thiepine, a 2,3-dihydrothiophene, a 2,5-dihydrothiophene, a hydroxy, a carboxyl, an oxirane, an oxirene, an oxetane, an oxolane, a furan, an oxane, a pyran, an oxepane, an oxepine, a 2,5-dihydrofuran, a 2,3-dihydrofuran, an amine, an aziridine, an azetidine, an azete, a pyrrolidine, a pyrrole, a piperidine, a pyridine, an azepane, an azepine, a 1-pyrroline, a 2-pyrroline, a 3-pyrroline, a dihydropyridine, a cyano group, a fluoro group, a chloro group, a bromo group, and an iodo group. In some embodiments, the cross linker group includes an alkyl oxide, an alkene, an alkyne, or a triazine.

Figure 6B:
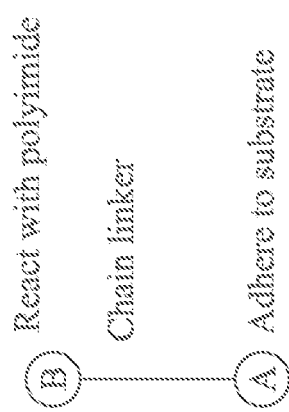
FIG. 6B illustrates the adhesion promotor without a capping solvent.
Figure 6C:
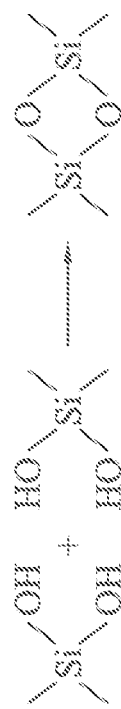
FIG. 6C illustrates a solution of the adhesion promotor and a capping solvent according to embodiments of the disclosure.
Figure 6C:
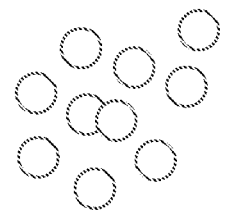

FIG. 6B illustrates the adhesion promotor without a capping solvent. The silanol groups on the adhesion promotor are not stable. Without the capping solvent, the silanol groups on the adhesion promotor will react with each other and form a silicon gel. FIG. 6C illustrates a solution of the adhesion promotor and a capping solvent (first solvent) according to embodiments of the disclosure. The capping solvent solvates the silanol groups to keep the adhesion promotor in a solution until the silanol groups on the adhesion promotor react with silanol groups on the passivation layer 30 to adhere the adhesion promotor to the passivation layer 30.

In some embodiments, the capping solvent (first solvent) is one or more selected from the group consisting of 1-propanol, 2-propanol, 1-butanol, 2-butanol, isobutanol, tert-butanol, pentan-2-ol, 3-methylbutan-1-ol, 3-methylbutan-2-ol, 2-methylbutan-1-ol, 2,2-dimethylpropan-1-ol, pentan-3-ol, pentan-2-ol, 3-methylbutan-2-ol, 2-methylbutan-2-ol, 1,2-butanediol, 1,3-butanediol, 1,4-butanediol, 2,3-butanediol, ethylene glycol, diethylene glycol, glycerol, 2-methoxyethanol, 2-ethoxyethanol, 2-propoxyethanol, 2-isopropoxyethanol, 2-butoxyethanol, 2-phenoxyethanol, 2-benzoyloxyethanol, 1-methoxy-2-propanol, 1-ethoxy-2-propanol, 1-propoxy-2-propanol, methyl carbitol, carbitol cellosolve, butyl carbitol, dipropyleneglycol methyl ether, tripropylene glycol methyl ether, and a crown ether selected from the group consisting of 12-crown-4, 15-crown-5, 18-crown-6, dibenzo-18-crown-6, and combinations thereof. In some embodiments, the polyamic acid composition contains up to 30 wt. % of the first solvent based on the total weight of the polyamic acid composition. In some embodiments, the polyamic acid composition includes a second solvent selected from the group consisting of one or more of N-methyl-2-pyrrolidone, gamma butyrolactone, and propylene glycol methyl ether acetate. In some embodiments, the concentration of the capping solvent in the polyamic acid composition is up to 30 wt. % based on the total weight of the polyamic acid composition.

Figure 7:
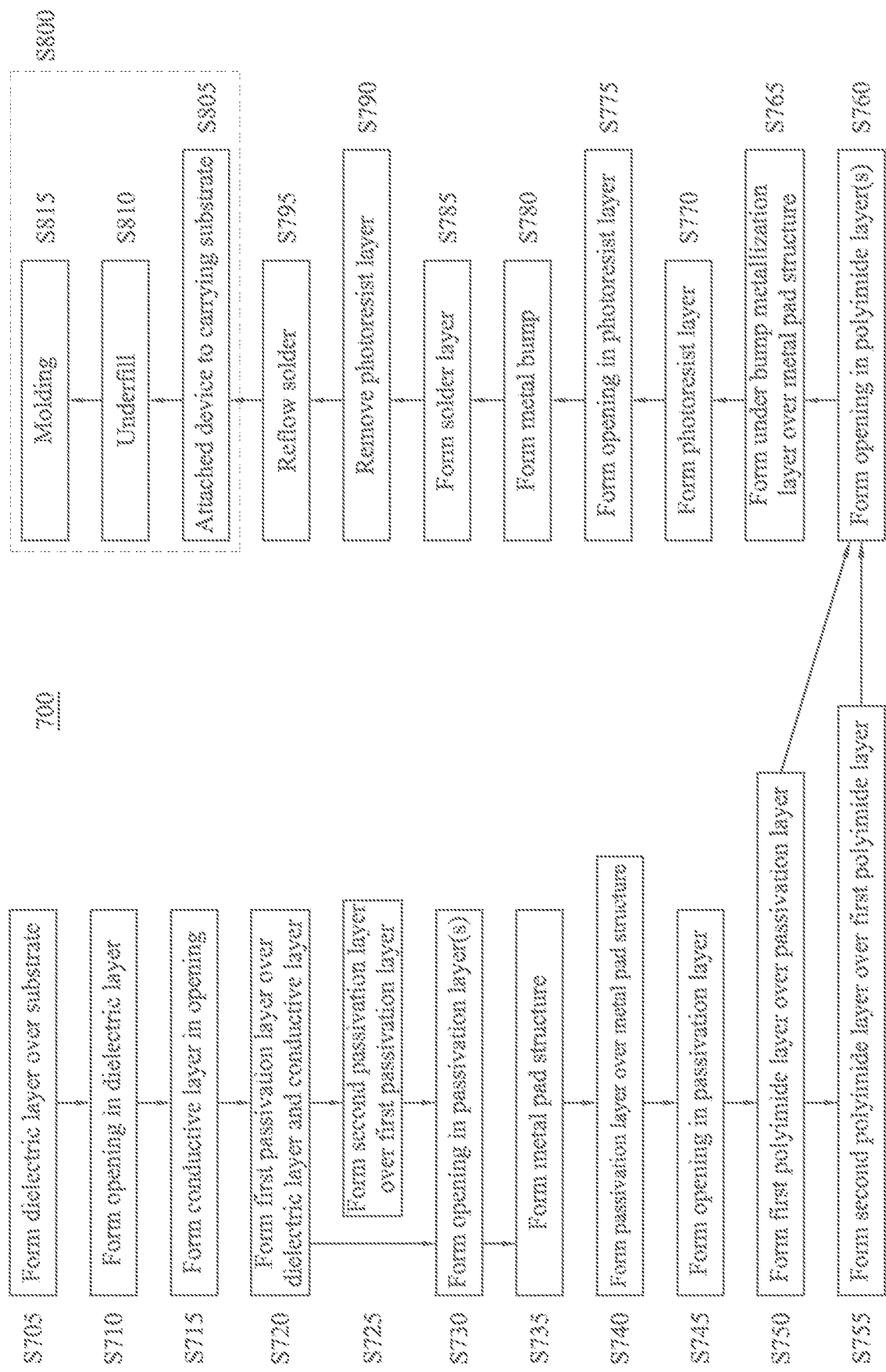
FIG. 7 illustrates a process flow for manufacturing a semiconductor device according to embodiments of the disclosure.

An embodiment of the disclosure includes a method 700 of manufacturing a semiconductor device, as illustrated in the flowchart of FIG. 7. A dielectric layer 15, such as an interlayer dielectric (ILD) layer, is formed over a substrate 10 in operation S705 (see FIG. 1A). In some embodiments, the substrate 10 includes a semiconductor device 5 disposed over a semiconductor wafer. In some embodiments, the semiconductor device 5 includes one or more transistors, capacitors, inductors, resistors, diodes, integrated circuits, and related wiring and interconnects embedded in an insulating layer.

In operation S710, an opening or trench 17 is formed in the dielectric layer 15 using suitable photolithographic and etching operations, as shown in FIG. 1B. The opening 17 is positioned over electrical contacts on the semiconductor device 5 in the substrate in some embodiments. Next, the opening 17 is subsequently filled with an electrically conductive material, such as a metal, in operation S715, to form a metal contact 20 (see FIG. 1C). In some embodiments, after depositing the metal, a planarization operation is performed to remove metal overlying the upper surface of the dielectric layer 15.

A passivation layer 25 is subsequently formed over the dielectric layer 15 and the metal contact 20 in operation S720 (see FIG. 1D). In some embodiments, the passivation layer 25 is a first passivation layer and a second or additional passivation layers 30 are formed over the first passivation layer 25 in operation S725 (see FIG. 1E). In some embodiments, the first passivation layer 25 and the second passivation layer 30 are formed of different materials. The first and second passivation layers 25, 30 may be an oxide layer, such as a silicon oxide, or a nitride layer, such as a silicon nitride. In some embodiments, the first or second passivation layer 25, 30 is an extreme low-k (ELK) material.

In operation S730, an opening 33 is formed in the passivation layer(s) using suitable photolithographic and etching operations exposing the metal contact 20 (see FIG. 1F). Then, a metal pad structure 35 is formed by forming a metal layer over the opening 33 and the passivation layer 30 in operation S730 (see FIG. 1G). In some embodiments, the metal pad structure 35 is made of aluminum, copper, silver, gold, nickel, tungsten, titanium, tin, titanium nitride, hafnium, ruthenium, tantalum, tantalum nitride, alloys thereof, or multilayers thereof. In some embodiments, the metal pad is an AlCu alloy. In some embodiments, portions of the metal layer overlying the second passivation layer 30 are removed by suitable photolithographic and etching operations to form the metal pad structure 35.

After forming the metal pad structure 35, deposition of the second passivation layer 30 continues in operation S740 so that the second passivation layer 30 covers the top surface of the metal pad structure 35. The second passivation layer 30 is planarized, such as by CMP or an etchback, and an opening 37 is formed in the second passivation layer 30 over the metal pad structure 35 in operation S745 using suitable photolithographic and etching operations (see FIG. 1H).

Then, in operation S750, a polyimide layer 40 including a polyimide is formed over the second passivation layer 30 and the metal pad structure 35. The polyimide film 40 is patterned to expose the surface of the metal pad structure 35 through an opening 37' (see FIG. 1L). In some embodiments, the polyimide layer 40 is made by forming a polyamic acid composition including a polyamic acid over the device and then converting the polyamic acid to a polyimide by heating the polyamic acid at a temperature ranging from about 150° C. to about 350° C. The polyamic acid is a reaction product of any of the dianhydrides and diamines disclosed herein in reference to FIG. 1L. In some embodiments, the polyimide layer is a first polyimide layer 40a and a second polyimide layer 40b is formed over the first polyimide layer 40a in operation S755 (see FIG. 5B). The second polyimide layer 40b is made of any of the polyamic acid compositions disclosed with reference to FIG. 1L, and the second polyimide layer 40b is made of a different polyimide than the first polyimide layer 40a. After forming the polyimide layers 40, 40a, 40b, an opening 37' is formed in the polyimide layers in operation S760.

In some embodiments, an under bump metallization layer (seed layer) 45 is formed over the polyimide layer 40, 40b and the metal pad structure 35 in operation S765 (see FIGS. 1J and 5C). In some embodiments, the under bump metallization layer 45 includes a bilayer of a titanium-based layer and a copper-based layer.

In operation S770, a photoresist layer 50 is formed over the under bump metallization layer 45 or polyimide layer 40, 40b (see FIGS. 1K and 5D). The photoresist layer 50 is patterned using suitable photolithographic operations to form an opening 53 in the photoresist layer over the metal pad structure 35. A metal bump 55 is subsequently disposed over the metal pad structure 35 and the polyimide layer 40, 40b in operation S780. In some embodiments, the metal bump 55 is formed by electroplating, physical vapor deposition, chemical vapor deposition, or evaporation deposition. Then, a solder layer 60 is formed over the metal bump in operation S785 (see FIGS. 1L and 5E).

Next, the photoresist layer 50 is removed in operation S790 (see FIGS. 1M and 5F), using a suitable photoresist removal technique, such as a solvent stripping operation or plasma ashing operation. After removal of the photoresist layer 50, the solder layer 60 is reflowed in some embodiments in operation S795 (see FIGS. 1N and 5G).

Additional operations S800 are performed on the structures of FIGS. 1N, 4C, and 5G. In some embodiments, the additional operations including sawing the substrate to separate a plurality of structures formed on the substrate into individual dies and then subsequently packaging the individual dies. In some embodiments, the dies are attached to a chip carrying substrate through the bump structures in operation S805. In some embodiments, the dies are attached by a flip-chip bonding operation. In some embodiments, the chip carrying substrate is a printed circuit board or an interposer.

After attaching the dies to a carrying substrate, an underfill material is applied to the area between the bottom of the die and carrying substrate in operation S810. The underfill material protects and insulates the bonded bump structures. The underfill material further enhances the adhesion of the die to the carrying substrate.

In some embodiments, one or more additional components, such as a heat spreader, is attached to the main surface of the die opposing the surface of the die facing the carrying substrate. In operation S815, the device is molded in a molding material, such as an epoxy, to protect and insulate the device. After any of the operations disclosed herein, an inspection or electrical testing of the device is performed in some embodiments to ensure the quality and operability of the device.

In some embodiments of the disclosure, the Young's modulus of the polyimide layer of a bump structure is increased to a range of from about 4.5 GPa to about 7 GPa. Embodiments of the disclosure having polyimide layers with the disclosed range of Young's modulus prevent delamination of the polyimide layer from an underlying passivation layer, thereby preventing damage to the underlying passivation layer. Embodiments of the disclosure provide improved protection of underlying extreme low-k (ELK) passivation layers. Devices having bump structures according to the present disclosure avoided delamination even after being subjected to pressure over 100 times during abuse testing.

An embodiment of the disclosure is a method of manufacturing a bump structure, including forming a passivation layer over a substrate. A metal pad structure is formed over the substrate, wherein the passivation layer surrounds the metal pad structure. A polyimide layer including a polyimide is formed over the passivation layer and the metal pad structure. A metal bump is formed over the metal pad structure and the polyimide layer. The polyimide is a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —CH$_2$—, —CH═CH—, —C≡C—, —O—, —C(O)O—, —CF$_3$CH$_2$CF$_3$—, —CH$_3$CH$_2$CH$_3$—, —SH—, and —SO$_2$—. In an embodiment, at least one of the dianhydride and the diamine includes a cycloalkane selected from the group consisting of cyclopropane, cyclobutane, cyclopentane, cyclohexane, cycloheptane, and cyclooctane. In an embodiment, at least one of the dianhydride and the diamine includes a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, the forming the passivation layer includes: forming a first passivation layer over the substrate; and forming a second passivation layer over the first passivation layer, wherein the first passivation layer and the second passivation layer are made of different materials. In an embodiment, the forming the polyimide layer includes: forming a first polyimide layer including a first polyimide over the passivation layer; and forming a second polyimide layer including a second polyimide, wherein each of the first polyimide and the second polyimide are a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, at least one of the dianhydride and the diamine includes bicyclo[3.2.0]heptane. In an embodiment, wherein at least one of the dianhydride and the diamine includes adamantane. In an embodiment, at least one of the dianhydride and the diamine includes spiro[2.2]pentane. In an embodiment, at least one of the dianhydride and the diamine includes a heterocyclic ring selected from the group consisting of thiolane, oxolane, and pyrrole. In an embodiment, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis(2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride. In an embodiment, the diamine is selected from the group consisting of bis(aminoethyl)norbornane, 2,6-diaminoanthraquinone, 1,5-diaminonaphthalene, 4,4''-diamino-p-terphenyl, 9,9-bis(4-aminophenyl)fluorene, 2,7-diaminofluorene, 2,6-diaminopyridine, and 3,6-diaminocarbazole. In an embodiment, the metal bump is formed of a metal selected from the group consisting of aluminum, copper, chromium, iron, manganese, magnesium, molybdenum, nickel, tin, niobium, tantalum, titanium, tungsten, zinc, and alloys thereof. In an embodiment, the method includes forming a solder layer over the metal bump. In an embodiment, the solder layer is made of a tin-containing alloy selected from the group consisting of PbSn, AgSn, SnAgCu, CuSnNi, AgCuSbSn, AuSn, and CuSn. In an embodiment, the first passivation layer is made of a silicon oxide or a silicon nitride. In an embodiment, the second passivation layer is made of a silicon oxide or a silicon nitride. In an embodiment, the polyimide layer has a Young's modulus ranging from 4.5 GPa to 7 GPa. In an embodiment, the forming the polyimide layer includes heating a polyamic acid layer at a temperature ranging from 150° C. to 350° C. In an embodiment, the method includes patterning the polyimide layer to expose the metal pad structure before forming the metal bump. In an embodiment, the metal pad structure is made of aluminum, copper, silver, gold, nickel, tungsten, titanium, tin, titanium nitride, hafnium, ruthenium, tantalum, tantalum nitride, alloys thereof, or multilayers thereof. In an embodiment, the method includes forming an under bump metallization layer over the metal pad structure and the polyimide layer before forming the metal bump. In an embodiment, the under bump metallization layer includes a bilayer of a titanium-based layer and a copper-based layer. In an embodiment, the titanium-based layer includes titanium, titanium alloys, and titanium compounds containing 50 mol % or greater titanium, and the copper-based layer includes copper, copper alloys, and copper compounds containing 50 mol % or greater copper. In an embodiment, the method includes forming a photoresist layer over the passivation layer or the under bump metallization layer, and patterning the photoresist layer to form an opening in the photoresist layer over the metal pad structure before forming the metal bump. In an embodiment, the forming the metal bump includes forming a metal layer over the metal pad structure in the opening in the photoresist layer, and removing the photoresist layer. In an embodiment, the method includes forming a solder layer over the metal layer before removing the photoresist layer. In an embodiment, the method includes removing exposed portions of the under bump metallization layer after removing the photoresist layer. In an embodiment, the method includes reflowing the solder layer to form a solder bump.

Another embodiment of the disclosure is a method of manufacturing a bump structure includes forming a passivation layer over a substrate. A metal pad structure is formed over the substrate, wherein the passivation layer surrounds the metal pad structure. A polyimide layer including a polyimide is formed over the passivation layer and the metal pad structure, and a metal bump is formed over the metal pad structure and the polyimide layer. The metal bump is in electrical contact with the metal pad structure, and the polyimide layer is adhered to the passivation layer and the metal pad structure by an adhesion promotor, wherein the adhesion promotor is chemically bonded to the polyimide, the passivation layer, and the metal pad structure. In an embodiment, the forming the polyimide layer includes combining polyamic acid, adhesion promotor, and a first solvent to form a polyamic acid composition; applying the polyamic acid composition to the passivation layer and metal pad structure; and heating the polyamic acid composition to a temperature ranging from 150° C. to 350° C. to convert the polyamic acid to the polyimide. In an embodiment, the polyamic acid is a reaction product of a dianhydride and a diamine, wherein at least one of the dianhydride and the diamine include one selected from the group consisting of a cycloalkane, a fused ring, a bicycloalkane, a tricycloalkane, a bicycloalkene, a tricycloalkene, a spiroalkane, and a heterocyclic ring. In an embodiment, the adhesion promotor includes a chelating group, silanol group, and a cross linker group. In an embodiment, the chelating group includes at least one of N, O, S, or a halogen. In an embodiment, the chelating group includes at least one of a thiol, a thiirane, a thiirene, a thietane, a thiolane, a thiophene, a thiane, a thiopyran, a thiepane, a thiepine, a 2,3-dihydrothiophene, a 2,5-dihydrothiophene, a hydroxy, a carboxyl, an oxirane, an oxirene, an oxetane, an oxolane, a furan, an oxane, a pyran, an oxepane, an oxepine, a 2,5-dihydrofuran, a 2,3-dihydrofuran, an amine, an aziridine, an azetidine, an azete, a pyrrolidine, a pyrrole, a piperidine, a pyridine, an azepane, an azepine, a 1-pyrroline, a 2-pyrroline, a 3-pyrroline, a dihydropyridine, a cyano group, a fluoro group, a chloro group, a bromo group, or an iodo group. In an embodiment, the cross linker group includes an alkyl oxide, an alkene, an alkyne, or a triazine. In an embodiment, the first solvent is at least one of 1-propanol, 2-propanol, 1-butanol, 2-butanol, isobutanol, tert-butanol, pentan-2-ol, 3-methylbutan-1-ol, 3-methylbutan-2-ol, 2-methylbutan-1-ol, 2,2-dimethylpropan-1-ol, pentan-3-ol, pentan-2-ol, 3-methylbutan-2-ol, 2-methylbutan-2-ol, 1,2-butanediol, 1,3-butanediol, 1,4-butanediol, 2,3-butanediol, ethylene glycol, diethylene glycol, glycerol, 2-methoxyethanol, 2-ethoxyethanol, 2-propoxyethanol, 2-isopropoxyethanol, 2-butoxyethanol, 2-phenoxyethanol, 2-benzoyloxyethanol, 1-methoxy-2-propanol, 1-ethoxy-2-propanol, 1-propoxy-2-propanol, methyl carbitol, carbitol cellosolve, butyl carbitol, dipropyleneglycol methyl ether, tripropylene glycol methyl ether, or a crown ether selected from the group consisting of 12-crown-4, 15-crown-5, 18-crown-6, dibenzo-18-crown-6, and combinations thereof. In an embodiment, the polyamic acid composition contains up to 30 wt. % of the first solvent based on a total weight of the polyamic acid composition. In an embodiment, the polyamic acid composition includes a second solvent, and the second solvent is at least one of N-methyl-2-pyrrolidone, gamma butyrolactone, or propylene glycol methyl ether acetate. In an embodiment, the polyamic acid is a reaction product of a dianhydride and a diamine, and at least one of the dianhydride and the diamine includes a cycloalkane, a fused ring, a bicycloalkane, a tricycloalkane, a bicycloalkene, a tricycloalkene, a spiroalkane, or a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —CH$_2$—, —CH=CH—, —C≡C—, —O—, —C(O)O—, —CF$_3$CH$_2$CF$_3$—, —CH$_3$CH$_2$CH$_3$—, —SH—, and —SO$_2$—. In an embodiment, at least one of the dianhydride and the diamine includes a cycloalkane, and the cycloalkane is selected from the group consisting of cyclopropane, cyclobutane, cyclopentane, cyclohexane, cycloheptane, and cyclooctane. In an embodiment, at least one of the dianhydride and the diamine includes a fused ring, and the fused ring is selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, at least one of dianhydride and diamine is bicyclo[3.2.0]heptane. In an embodiment, at least one of dianhydride and diamine is adamantane. In an embodiment, at least one of dianhydride and diamine is spiro[2.2]pentane. In an embodiment, at least one of dianhydride and diamine is a heterocyclic ring selected from the group consisting of thiolane, oxolane, and pyrrole. In an embodiment, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis(2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride. In an embodiment, the diamine is selected from the group consisting of bis(aminoethyl)norbornane, 2,6-diaminoanthraquinone, 1,5-diaminonaphthalene, 4,4"-diamino-p-terphenyl, 9,9-bis(4-aminophenyl)fluorene, 2,7-diaminofluorene, 2,6-diaminopyridine, and 3,6-diaminocarbazole. In an embodiment, the metal bump is formed of a metal selected from the group consisting of aluminum, copper, chromium, iron, manganese, magnesium, molybdenum, nickel, tin, niobium, tantalum, titanium, tungsten, zinc, and alloys thereof. In an embodiment, the method includes forming a solder layer over the metal bump. In an embodiment, the solder layer is made of a tin-containing alloy selected from the group consisting of PbSn, AgSn, SnAgCu, CuSnNi, AgCuSbSn, AuSn, and CuSn. In an embodiment, the forming the passivation layer includes: forming a first passivation layer over the substrate; and forming a second passivation layer over the first passivation layer, wherein the first passivation layer and the second passivation layer are made of different materials. In an embodiment, the first passivation layer is made of a silicon oxide or a silicon nitride. In an embodiment, the second passivation layer is made of a silicon oxide or a silicon nitride. In an embodiment, the polyimide layer has a Young's modulus ranging from 4.5 GPa to 7 GPa. In an embodiment, the forming the polyimide layer includes: forming a first polyimide layer including a first polyimide over the passivation layer; and forming a second polyimide layer including a second polyimide over the first polyimide layer, wherein each of the first polyimide and the second polyimide are a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, the method includes patterning the polyimide layer to expose the metal pad structure before forming the metal bump. In an embodiment, the metal pad structure is made of aluminum, copper, silver, gold, nickel, tungsten, titanium, tin, titanium nitride, hafnium, ruthenium, tantalum, tantalum nitride, alloys thereof, or multilayers thereof. In an embodiment, the method includes forming an under bump metallization layer over the metal pad structure and the polyimide layer before forming the metal bump. In an embodiment, the under bump metallization layer includes a bilayer of a titanium-based layer and a copper-based layer. In an embodiment, the titanium-based layer comprises titanium, titanium alloys, and titanium compounds containing 50 mol % or greater titanium, and the copper-based layer includes copper, copper alloys, and copper compounds containing 50 mol % or greater copper. In an embodiment, the method includes forming a photoresist layer over the passivation layer or the under bump metallization layer, and patterning the photoresist layer to form an opening in the photoresist layer over the metal pad structure before forming the metal bump. In an embodiment, the forming the metal bump includes forming a metal layer over the metal pad structure in the opening in the photoresist layer, and removing the photoresist layer. In an embodiment, the method includes forming a solder layer over the metal layer before removing the photoresist layer. In an embodiment, the method includes removing exposed portions of the under bump metallization layer after removing the photoresist layer. In an embodiment, the method includes reflowing the solder layer to form a solder bump.

Another embodiment of the disclosure is a bump structure, including a passivation layer surrounding a metal pad, and a polyimide layer including a polyimide disposed over the passivation layer and the metal pad. A metal bump is disposed over the metal pad and the polyimide layer. The metal bump is in electrical contact with the metal pad, and the polyimide is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —CH$_2$—, —CH=CH—, —C≡C—, —O—, —C(O)O—, —CF$_3$CH$_2$CF$_3$—, —CH$_3$CH$_2$CH$_3$—, —SH—, and —SO$_2$—. In an embodiment, at least one of the dianhydride and the diamine includes a cycloalkane selected from the group consisting of cyclopropane, cyclobutane, cyclopentane, cyclohexane, cycloheptane, and cyclooctane. In an embodiment, at least one of the dianhydride and the diamine includes a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, at least one of the dianhydride and the diamine is bicyclo[3.2.0]heptane. In an embodiment, at least one of the dianhydride and the diamine is adamantane. In an embodiment, at least one of the dianhydride and the diamine is spiro[2.2]pentane. In an embodiment, at least one of the dianhydride and the diamine is a heterocyclic ring selected from the group consisting of thiolane, oxolane, and pyrrole. In an embodiment, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis(2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride. In an embodiment, the diamine is selected from the group consisting of bis(aminoethyl)norbornane, 2,6-diaminoanthraquinone, 1,5-diaminonaphthalene, 4,4''-diamino-p-terphenyl, 9,9-bis(4-aminophenyl)fluorene, 2,7-diaminofluorene, 2,6-diaminopyridine, and 3,6-diaminocarbazole. In an embodiment, the metal bump is formed of a metal selected from the group consisting of aluminum, copper, chromium, iron, manganese, magnesium, molybdenum, nickel, tin, niobium, tantalum, titanium, tungsten, zinc, and alloys thereof. In an embodiment, the bump structure includes a solder layer disposed over the metal bump. In an embodiment, the solder layer is made of a tin-containing alloy selected from the group consisting of PbSn, AgSn, SnAgCu, CuSnNi, AgCuSbSn, AuSn, and CuSn. In an embodiment, the passivation layer includes a first passivation layer and a second passivation layer, and the first passivation layer and the second passivation layer are made of different materials. In an embodiment, the first passivation layer is made of a silicon oxide or a silicon nitride. In an embodiment, the second passivation layer is made of a silicon oxide or a silicon nitride. In an embodiment, the polyimide layer has a Young's modulus ranging from 4.5 GPa to 7 GPa. In an embodiment, the polyimide layer includes a first polyimide layer including a first polyimide and a second polyimide layer disposed over the first polyimide layer including a second polyimide, each of the first polyimide and the second polyimide are a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, the metal pad is made of aluminum, copper, silver, gold, nickel, tungsten, titanium, tin, titanium nitride, hafnium, ruthenium, tantalum, tantalum nitride, alloys thereof, or multilayers thereof. In an embodiment, the bump structure includes an under bump metallization layer disposed between the metal bump and the metal pad. In an embodiment, the under bump metallization layer includes a bilayer of a titanium-based layer and a copper-based layer. In an embodiment, the titanium-based layer includes titanium, titanium alloys, and titanium compounds containing 50 mol % or greater titanium, and the copper-based layer includes copper, copper alloys, and copper compounds containing 50 mol % or greater copper.

Another embodiment of the disclosure is a bump structure, including a passivation layer surrounding a metal pad structure. A polyimide layer including a polyimide is disposed over the passivation layer and the metal pad structure. A metal bump is disposed over the metal pad structure and the polyimide layer, wherein the metal bump is in electrical contact with the metal pad structure. The polyimide layer is adhered to the passivation layer and the metal pad structure by an adhesion promotor, wherein the adhesion promotor is chemically bonded to the polyimide, the passivation layer, and the metal pad structure. In an embodiment, the adhesion promotor is bonded to the polyimide through cross-linking groups on the adhesion promotor. In an embodiment, the cross-linking groups are one or more selected from the group consisting of an alkyl oxide group, an alkene group, an alkyne group, and a triazine group. In an embodiment, the adhesion promotor is bonded to the passivation layer through silanol groups on the adhesion promotor. In an embodiment, the adhesion promotor is bonded to the metal pad structure. In an embodiment, the polyimide is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—. In an embodiment, at least one of the dianhydride and the diamine is a cycloalkane is selected from the group consisting of cyclopropane, cyclobutane, cyclopentane, cyclohexane, cycloheptane, and cyclooctane. In an embodiment, at least one of the dianhydride and the diamine is a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, at least one of the dianhydride and the diamine is bicyclo[3.2.0]heptane. In an embodiment, at least one of the dianhydride and the diamine is adamantane. In an embodiment, at least one of the dianhydride and the diamine is spiro[2.2]pentane. In an embodiment, at least one of the dianhydride and the diamine is a heterocyclic ring selected from the group consisting of thiolane, oxolane, and pyrrole. In an embodiment, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis (2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride. In an embodiment, the diamine is selected from the group consisting of bis(aminoethyl)norbornane, 2,6-diaminoanthraquinone, 1,5-diaminonaphthalene, 4,4''-diamino-p-terphenyl, 9,9-bis(4-aminophenyl)fluorene, 2,7-diaminofluorene, 2,6-diaminopyridine, and 3,6-diaminocarbazole. In an embodiment, the metal bump is formed of a metal selected from the group consisting of aluminum, copper, chromium, iron, manganese, magnesium, molybdenum, nickel, tin, niobium, tantalum, titanium, tungsten, zinc, and alloys thereof. In an embodiment, the bump structure includes a solder layer disposed over the metal bump. In an embodiment, the solder layer is made of a tin-containing alloy selected from the group consisting of PbSn, AgSn, SnAgCu, CuSnNi, AgCuSbSn, AuSn, and CuSn. In an embodiment, the passivation layer includes a first passivation layer and a second passivation layer, wherein the first passivation layer and the second passivation layer are made of different materials. In an embodiment, the first passivation layer is made of a silicon oxide or a silicon nitride. In an embodiment, the second passivation layer is made of a silicon oxide or a silicon nitride. In an embodiment, the polyimide layer has a Young's modulus ranging from 4.5 GPa to 7 GPa. In an embodiment, the polyimide layer includes a first polyimide layer including a first polyimide and a second polyimide layer disposed over the first polyimide layer including a second polyimide, each of the first polyimide and the second polyimide are a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, the metal pad structure is made of aluminum, copper, silver, gold, nickel, tungsten, titanium, tin, titanium nitride, hafnium, ruthenium, tantalum, tantalum nitride, alloys thereof, or multilayers thereof. In an embodiment, the metal pad structure includes a metal contact pad and an under bump metallization layer disposed over the metal contact pad. In an embodiment, the under bump metallization layer comprises a bilayer of a titanium-based layer and a copper-based layer. In an embodiment, the titanium-based layer comprises titanium, titanium alloys, and titanium compounds containing 50 mol % or greater titanium, and the copper-based layer includes copper, copper alloys, and copper compounds containing 50 mol % or greater copper.

Another embodiment of the disclosure is a polyamic acid composition, including a polyamic acid, an adhesion promotor, and a first solvent. The adhesion promoter includes a chelating group, silanol group, and a cross linker group, wherein the chelating group includes one or more of N, O, S, and a halogen. In an embodiment, the chelating group is one or more of a thiol, a thiirane, a thiirene, a thietane, a thiolane, a thiophene, a thiane, a thiopyran, a thiepane, a thiepine, a 2,3-dihydrothiophene, a 2,5-dihydrothiophene, a hydroxy, a carboxyl, an oxirane, an oxirene, an oxetane, an oxolane, a furan, an oxane, a pyran, an oxepane, an oxepine, a 2,5-dihydrofuran, a 2,3-dihydrofuran, an amine, an aziridine, an azetidine, an azete, a pyrrolidine, a pyrrole, a piperidine, a pyridine, an azepane, an azepine, a 1-pyrroline, a 2-pyrroline, a 3-pyrroline, a dihydropyridine, a cyano group, a fluoro group, a chloro group, a bromo group, or an iodo group. In an embodiment, the cross linker group includes an alkyl oxide, an alkene, an alkyne, or a triazine. In an embodiment, the first solvent is one or more of 1-propanol, 2-propanol, 1-butanol, 2-butanol, isobutanol, tert-butanol, pentan-2-ol, 3-methylbutan-1-ol, 3-methylbutan-2-ol, 2-methylbutan-1-ol, 2,2-dimethylpropan-1-ol, pentan-3-ol, pentan-2-ol, 3-methylbutan-2-ol, 2-methylbutan-2-ol, 1,2-butanediol, 1,3-butanediol, 1,4-butanediol, 2,3-butanediol, ethylene glycol, diethylene glycol, glycerol, 2-methoxyethanol, 2-ethoxyethanol, 2-propoxyethanol, 2-isopropoxyethanol, 2-butoxyethanol, 2-phenoxyethanol, 2-benzoyloxyethanol, 1-methoxy-2-propanol, 1-ethoxy-2-propanol, 1-propoxy-2-propanol, methyl carbitol, carbitol cellosolve, butyl carbitol, dipropyleneglycol methyl ether, tripropylene glycol methyl ether, or a crown ether selected from the group consisting of 12-crown-4, 15-crown-5, 18-crown-6, and dibenzo-18-crown-6. In an embodiment, the polyamic acid composition contains up to 30 wt. % of the first solvent based on a weight of the polyamic acid composition. In an embodiment, the polyamic acid composition includes a second solvent selected from one or more of N-methyl-2-pyrrolidone, gamma butyrolactone, or propylene glycol methyl ether acetate. In an embodiment, the polyamic acid is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, the at least one of the dianhydride and the diamine includes a tricycloalkane or tricycloalkene. In an embodiment, the at least one of the dianhydride and the diamine includes two or more cyclic groups. In an embodiment, the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—. In an embodiment, at least one of the dianhydride and the diamine is a cycloalkane selected from the group consisting of cyclopropane, cyclobutane, cyclopentane, cyclohexane, cycloheptane, and cyclooctane. In an embodiment, at least one of the dianhydride and the diamine is a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, at least one of the dianhydride and the diamine is bicyclo[3.2.0]heptane. In an embodiment, at least one of the dianhydride and the diamine is adamantane. In an embodiment, at least one of the dianhydride and the diamine is spiro[2.2]pentane. In an embodiment, at least one of the dianhydride and the diamine is a heterocyclic ring selected from the group consisting of thiolane, oxolane, and pyrrole. In an embodiment, the dianhydride is selected from the group consisting of cyclobutanetetracarboxylic dianhydride, 4,4'-biphthalic anhydride, bicyclo[2.2.2]oct-7-ene-2,3,5,6-tetracarboxylic dianhydride, 5,5'-(9H-fluorene-9,9-diyl)bis(2-benzofuran-1,3-dione), 2,3,6,7-naphthalenetetracarboxylic 2,3:6,7-dianhydride, 3,4,9,10-perylenetetracarboxylic dianhydride, and 4,4'-(ethyne-1,2-diyl)-diphthalic anhydride. In an embodiment, the diamine is selected from the group consisting of bis(aminoethyl)norbornane, 2,6-diaminoanthraquinone, 1,5-diaminonaphthalene, 4,4''-diamino-p-terphenyl, 9,9-bis(4-aminophenyl)fluorene, 2,7-diaminofluorene, 2,6-diaminopyridine, and 3,6-diaminocarbazole.

Another embodiment is a method of manufacturing a semiconductor device, including forming a first passivation layer over a substrate, and forming an opening in the first passivation layer. A metal pad structure is formed in the opening. A second passivation layer is formed over the metal pad structure. The first passivation layer and the second passivation layer are formed of different materials. An opening is formed in the second passivation layer over the metal pad structure exposing a portion of the metal pad structure. A polyimide layer including a polyimide is formed over the second passivation layer and the metal pad structure. A metal bump is formed over the metal pad structure and the polyimide layer. The polyimide is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—. In an embodiment, at least one of the dianhydride and the diamine includes a cycloalkane selected from the group consisting of cyclopropane, cyclobutane, cyclopentane, cyclohexane, cycloheptane, and cyclooctane. In an embodiment, at least one of the dianhydride and the diamine includes a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, the forming the polyimide layer includes: forming a first polyimide layer including a first polyimide over the second passivation layer; and forming a second polyimide layer including a second polyimide, wherein each of the first polyimide and the second polyimide are a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, the metal bump is in electrical contact with the metal pad structure, the polyimide layer is adhered to the second passivation layer and the metal pad structure by an adhesion promotor, and the adhesion promotor is chemically bonded to the polyimide, the second passivation layer, and the metal pad structure. In an embodiment, the forming the polyimide layer includes: combining polyamic acid, adhesion promotor, and a first solvent to form a polyamic acid composition; applying the polyamic acid composition over the second passivation layer and metal pad structure; and heating the polyamic acid composition to a temperature ranging from 150° C. to 350° C. to convert the polyamic acid to the polyimide. In an embodiment, the polyamic acid is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, the adhesion promotor includes a chelating group, silanol group, and a cross linker group. In an embodiment, the chelating group comprises at least one of N, O, S, or a halogen. In an embodiment, the chelating group includes at least one of a thiol, a thiirane, a thiirene, a thietane, a thiolane, a thiophene, a thiane, a thiopyran, a thiepane, a thiepine, a 2,3-dihydrothiophene, a 2,5-dihydrothiophene, a hydroxy, a carboxyl, an oxirane, an oxirene, an oxetane, an oxolane, a furan, an oxane, a pyran, an oxepane, an oxepine, a 2,5-dihydrofuran, a 2,3-dihydrofuran, an amine, an aziridine, an azetidine, an azete, a pyrrolidine, a pyrrole, a piperidine, a pyridine, an azepane, an azepine, a 1-pyrroline, a 2-pyrroline, a 3-pyrroline, a dihydropyridine, a cyano group, a fluoro group, a chloro group, a bromo group, or an iodo group. In an embodiment, the substrate is a chip. In an embodiment, the method includes attaching the chip to a chip carrying substrate by bonding the chip to the chip carrying substrate through the metal bump. In an embodiment, the chip to is bonded to the chip carrying substrate using a flip-chip bonding operation. In an embodiment, the method includes filling a gap between the chip and the chip carrying substrate with an underfill material. In an embodiment, the method includes covering the chip and the chip carrying substrate with a molding material.

Another embodiment of the disclosure is a semiconductor device, including a chip bonded to a chip carrying substrate. A passivation layer is disposed over a main side of the chip facing the chip carrying substrate, wherein the passivation layer surrounds a first metal pad. A polyimide layer includes a polyimide disposed over the passivation layer and the first metal pad. A metal bump is disposed over the first metal pad and the polyimide layer. The metal bump is in electrical contact with the first metal pad and a second metal pad on the chip carrying substrate. The polyimide is a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring. In an embodiment, at least one of the dianhydride and the diamine includes a tricycloalkane or tricycloalkene. In an embodiment, at least one of the dianhydride and the diamine includes two or more cyclic groups. In an embodiment, the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—. In an embodiment, at least one of the dianhydride and the diamine includes a cycloalkane selected from the group consisting of cyclopropane, cyclobutane, cyclopentane, cyclohexane, cycloheptane, and cyclooctane. In an embodiment, at least one of the dianhydride and the diamine includes a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin. In an embodiment, the metal bump is formed of a metal selected from the group consisting of aluminum, copper, chromium, iron, manganese, magnesium, molybdenum, nickel, tin, niobium, tantalum, titanium, tungsten, zinc, and alloys thereof. In an embodiment, the semiconductor device includes a solder layer disposed over the metal bump. In an embodiment, the solder layer is made of a tin-containing alloy selected from the group consisting of PbSn, AgSn, SnAgCu, CuSnNi, AgCuSbSn, AuSn, and CuSn. In an embodiment, the passivation layer includes a first passivation layer and a second passivation layer, wherein the first passivation layer and the second passivation layer are made of different materials. In an embodiment, the first passivation layer is made of a silicon oxide or a silicon nitride. In an embodiment, the second passivation layer is made of a silicon oxide or a silicon nitride. In an embodiment, the polyimide layer has a Young's modulus ranging from 4.5 GPa to 7 GPa. In an embodiment, the polyimide layer includes a first polyimide layer including a first polyimide and a second polyimide layer disposed over the first polyimide layer including a second polyimide, each of the first polyimide and the second polyimide are a reaction product of a dianhydride and a diamine, wherein at least one of the dianhydride and the diamine includes one selected from the group consisting of a cycloalkane, a fused ring, a bicycloalkane, a tricycloalkane, a bicycloalkene, a tricycloalkene, a spiroalkane, and a heterocyclic ring, and the first polyimide and the second polyimide are different. In an embodiment, the first metal pad and second metal pad are made of aluminum, copper, silver, gold, nickel, tungsten, titanium, tin, titanium nitride, hafnium, ruthenium, tantalum, tantalum nitride, alloys thereof, or multilayers thereof. In an embodiment, an under bump metallization layer is disposed over the first metal pad. In an embodiment, the under bump metallization layer includes a bilayer of a titanium-based layer and a copper-based layer. In an embodiment, the titanium-based layer includes titanium, titanium alloys, and titanium compounds containing 50 mol % or greater titanium, and the copper-based layer includes copper, copper alloys, and copper compounds containing 50 mol % or greater copper.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a bump structure, comprising:
    forming a passivation layer over a substrate;
    forming a metal pad structure over the substrate, wherein the passivation layer surrounds the metal pad structure;
    forming a polyimide layer comprising a polyimide over the passivation layer and the metal pad structure; and
    forming a metal bump over the metal pad structure and the polyimide layer, wherein the polyimide is a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring,
    wherein the forming the passivation layer comprises:
    forming a first passivation layer over the substrate; and
    forming a second passivation layer over the first passivation layer,
    wherein the first passivation layer and the second passivation layer are made of different materials.

2. The method according to claim 1, wherein at least one of the dianhydride and the diamine comprises a tricycloalkane or tricycloalkene.

3. The method according to claim 1, wherein at least one of the dianhydride and the diamine comprises two or more cyclic groups.

4. The method according to claim 3, wherein the two or more cyclic groups are linked to each other by a linking group selected from the group consisting of —$CH_2$—, —CH=CH—, —C≡C—, —O—, —C(O)O—, —$CF_3CH_2CF_3$—, —$CH_3CH_2CH_3$—, —SH—, and —$SO_2$—.

5. The method according to claim 1, wherein at least one of the dianhydride and the diamine comprises a cycloalkane selected from the group consisting of cyclopropane, cyclobutane, cyclopentane, cyclohexane, cycloheptane, and cyclooctane.

6. The method according to claim 1, wherein at least one of the dianhydride and the diamine comprises a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin.

7. The method according to claim 1, wherein the forming the polyimide layer comprises:
    forming a first polyimide layer including a first polyimide over the passivation layer; and
    forming a second polyimide layer including a second polyimide,
    wherein each of the first polyimide and the second polyimide are a reaction product of a dianhydride and a diamine,
    wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring, and
    the first polyimide and the second polyimide are different.

8. A method of manufacturing a bump structure, comprising:
    forming a passivation layer over a substrate;
    forming a metal pad structure over the substrate, wherein the passivation layer surrounds the metal pad structure;
    forming a polyimide layer comprising a polyimide over the passivation layer and the metal pad structure; and
    forming a metal bump over the metal pad structure and the polyimide layer,
    wherein the metal bump is in electrical contact with the metal pad structure, and
    the polyimide layer is adhered to the passivation layer and the metal pad structure by an adhesion promotor, wherein the adhesion promotor is chemically bonded to the polyimide, the passivation layer, and the metal pad structure; and
    wherein the forming the polyimide layer comprises:
    combining a polyamic acid, an adhesion promotor, and a first solvent to form a polyamic acid composition;
    applying the polyamic acid composition to the passivation layer and metal pad structure; and
    heating the polyamic acid composition to a temperature ranging from 150° C. to 350° C. to convert the polyamic acid to the polyimide.

9. The method according to claim 8, wherein the polyamic acid is a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring.

10. The method according to claim 8, wherein the adhesion promotor comprises a chelating group, a silanol group, and a cross linker group.

11. The method according to claim 10, wherein the chelating group comprises at least one of N, O, S, or a halogen.

12. The method according to claim 10, wherein the chelating group includes at least one of a thiol, a thiirane, a thiirene, a thietane, a thiolane, a thiophene, a thiane, a thiopyran, a thiepane, a thiepine, a 2,3-dihydrothiophene, a 2,5-dihydrothiophene, a hydroxy, a carboxyl, an oxirane, an oxirene, an oxetane, an oxolane, a furan, an oxane, a pyran, an oxepane, an oxepine, a 2,5-dihydrofuran, a 2,3-dihydrofuran, an amine, an aziridine, an azetidine, an azete, a pyrrolidine, a pyrrole, a piperidine, a pyridine, an azepane, an azepine, a 1-pyrroline, a 2-pyrroline, a 3-pyrroline, a dihydropyridine, a cyano group, a fluoro group, a chloro group, a bromo group, or an iodo group.

13. The method according to claim 1, wherein the first passivation layer is an oxide or layer or a nitride layer.

14. The method according to claim 1, wherein the second passivation layer is an oxide layer or a nitride layer.

15. A bump structure, comprising:
    a passivation layer surrounding a metal pad;
    a polyimide layer including a polyimide disposed over the passivation layer and the metal pad; and
    a metal bump disposed over the metal pad and the polyimide layer,
    wherein the metal bump is in electrical contact with the metal pad, and
    the polyimide is a reaction product of a dianhydride and a diamine, wherein at least one of the dianhydride and the diamine comprises one selected from the group consisting of a cycloalkane, a fused ring, a bicycloalkane, a tricycloalkane, a bicycloalkene, a tricycloalkene, a spiroalkane, and a heterocyclic ring, wherein at least one of the dianhydride or the diamine comprises two or more cyclic groups, and the two or more cyclic groups are linked to each other by a linking group selected from the group consisting of —CH=CH—, —C≡C—, —O—, —C(O)O—, —CF$_3$CH$_2$CF$_3$—, —CH$_3$CH$_2$CH$_3$—, —SH—, and —SO$_2$—.

16. The bump structure of claim 15, wherein at least one of the dianhydride and the diamine comprises a tricycloalkane or tricycloalkene.

17. The bump structure of claim 15, wherein at least one of the dianhydride and the diamine comprises a cycloalkane selected from the group consisting of cyclopropane, cyclobutane, cyclopentane, cyclohexane, cycloheptane, and cyclooctane.

18. The bump structure of claim 15, wherein at least one of the dianhydride and the diamine comprises a fused ring selected from the group consisting of naphthalene, anthracene, phenanthrene, chrysene, pyrene, corannulene, coronene, hexahelicene, indole, isoindole, indolizine, quinoline, isoquinoline, purine, carbazole, dibenzofuran, xanthene, phenazine, phenoxazine, and phenoxathiin.

19. The bump structure of claim 15, wherein the passivation layer comprises:

a first passivation layer disposed over the substrate; and a second passivation layer disposed over the first passivation layer, wherein the first passivation layer and the second passivation layer are made of different materials.

20. The bump structure of claim 19, wherein the first passivation layer and second passivation layers are an oxide layer or a nitride layer.

* * * * *